(12) United States Patent
Fox

(10) Patent No.: US 6,713,796 B1
(45) Date of Patent: Mar. 30, 2004

(54) ISOLATED PHOTODIODE

(75) Inventor: Eric C. Fox, Waterloo (CA)

(73) Assignee: Dalsa, Inc., Ontario (CA)

( * ) Notice: Subject to any disclaimer, the term of this patent is extended or adjusted under 35 U.S.C. 154(b) by 0 days.

(21) Appl. No.: 10/044,974

(22) Filed: Jan. 15, 2002

Related U.S. Application Data
(60) Provisional application No. 60/262,382, filed on Jan. 19, 2001.

(51) Int. Cl.[7] ............... H01L 31/062; H01L 27/148
(52) U.S. Cl. .............. 257/292; 257/233; 257/290; 257/291; 257/232; 257/257; 257/258; 257/461; 257/462
(58) Field of Search ............... 257/222, 223, 257/225, 224, 233, 243, 229, 290, 291, 292, 232, 118, 257, 258, 461, 462; 438/75, 298, 312, 57, 22, 16, 70

(56) References Cited

U.S. PATENT DOCUMENTS

| | | | |
|---|---|---|---|
| 4,616,249 A | 10/1986 | Nishizawa et al. | 357/30 |
| 4,814,846 A | 3/1989 | Matsumoto et al. | 357/30 |
| 4,816,889 A | 3/1989 | Matsumoto | 357/30 |
| 5,029,321 A | 7/1991 | Kimura | 357/24 |
| 5,051,797 A | 9/1991 | Erhardt | 357/24 |
| 5,118,631 A | 6/1992 | Dyck et al. | 457/29 |
| 5,245,201 A | 9/1993 | Kozuka et al. | 257/53 |
| 5,252,851 A | 10/1993 | Mita et al. | 257/446 |
| 5,410,175 A | 4/1995 | Kyomasu et al. | 257/458 |
| 5,514,887 A * | 5/1996 | Hokari | 257/222 |
| 5,602,414 A | 2/1997 | Mitsui et al. | 257/442 |
| 5,614,744 A | 3/1997 | Merrill | 257/291 |
| 5,625,210 A | 4/1997 | Lee et al. | 257/292 |
| 5,668,390 A | 9/1997 | Morimoto | 257/232 |
| 5,714,796 A | 2/1998 | Chishiki | 257/544 |
| 5,841,159 A | 11/1998 | Lee et al. | 257/291 |
| 5,880,495 A | 3/1999 | Chen | 257/233 |
| 5,903,021 A | 5/1999 | Lee et al. | 257/292 |
| 5,904,493 A | 5/1999 | Lee et al. | 438/57 |
| 5,942,775 A | 8/1999 | Yiannoulos | 257/292 |
| 6,023,081 A | 2/2000 | Drowley et al. | 257/292 |
| 6,027,955 A | 2/2000 | Lee et al. | 438/57 |
| 6,051,447 A | 4/2000 | Lee et al. | 435/48 |
| 6,066,510 A | 5/2000 | Merrill | 438/57 |
| 6,100,551 A | 8/2000 | Lee et al. | 257/232 |
| 6,100,556 A | 8/2000 | Drowley et al. | 257/233 |
| 6,118,142 A | 9/2000 | Chen et al. | 257/232 |
| 6,171,885 B1 | 1/2001 | Fan et al. | 438/70 |
| 6,180,969 B1 | 1/2001 | Yang et al. | 257/291 |
| 6,297,070 B1 * | 10/2001 | Lee et al. | 438/57 |
| 6,326,230 B1 | 12/2001 | Pain et al. | 438/57 |
| 6,448,104 B1 * | 9/2002 | Watanabe | 257/292 |

FOREIGN PATENT DOCUMENTS

| | | | |
|---|---|---|---|
| EP | 0854516 A2 | 7/1998 | ......... H01L/27/146 |
| JP | 55-138026 | 10/1980 | |
| WO | WO 00/52765 | 9/2000 | ........... H01L/31/06 |

* cited by examiner

*Primary Examiner*—Minhloan Tran
*Assistant Examiner*—Tan Tran
(74) *Attorney, Agent, or Firm*—Dorsey & Whitney LLP

(57) ABSTRACT

A sensor formed in a substrate of a first conductivity type in a first concentration to express a first intrinsic potential includes CMOS circuitry to control the sensor, a first well of the first conductivity type in a second concentration (greater than the first concentration) formed in the substrate to express a second intrinsic potential, and a photodiode region of a second conductivity type formed in the first well. The first and second intrinsic potentials induce a field between the substrate and the first well that repels photo generated charge from drifting from the substrate into the first well. Alternatively, a sensor formed in a substrate of a first conductivity type includes CMOS circuitry to control the sensor, a first well of a second conductivity type formed in the substrate, a second well of the first conductivity type formed in the first well, and a photodiode region of the second conductivity type formed in the second well.

16 Claims, 10 Drawing Sheets

US 6,713,796 B1

ISOLATED PHOTODIODE

The priority benefit of the Jan. 19, 2001 filing date of provisional application serial No. 60/262,382 is hereby claimed.

BACKGROUND OF THE INVENTION

1. Field of the Invention

The present invention relates to CMOS image sensors. In particular, the invention relates to one or more isolation wells disposed between the substrate and a photodiode in a pixel of a CMOS image sensor to induce a field that repels photo generated charge from drifting into the photodiode.

2. Description of Related Art

CMOS image sensors are pushing to ever lower operating voltages and to ever smaller pixel pitches. They are also being targeted at more markets in which cheap illumination is an advantage. This generally means that the illumination wavelength is moving farther from the blue and into the near-infrared. These trends are leading to ever grater levels of electronic crosstalk in CMOS image sensors. Electronic crosstalk in this sense refers to the diffusion of photocharge that is generated outside (usually beneath) the depleted photosite into neighboring photosites or collection nodes. The result is that the charge generated by the light that is incident on a given pixel migrates to neighboring pixels and is interpreted as signal charge. This crosstalk leads to degradations in performance measures such as image spatial resolution (sharp features in the image become washed out) and color separation (red light enters a red pixel but shows up as signal in a blue pixel).

Crosstalk is also an issue for pixel architectures in which each photosite is accompanied by (an) adjacent sense/storage node(s). The purpose of the storage node is to store charge that was collected on a photosite during the previous integration period so as to hold that charge until a readout operation can take place. During the storage time it is undesirable to have photocharge diffuse onto the storage node. This leads to a "corrupted" level on the storage node which is subsequently read out. The same mechanism that leads to photosite crosstalk also produces storage node crosstalk.

SUMMARY OF THE INVENTION

It is an object to the present invention to overcome limitations in the prior art. It is a further object of the present invention to provide a sensor that isolates a photodiode from photo charge generated in nearby silicon.

These and other objects are achieved in an embodiment of a sensor formed in a substrate of a first conductivity type in a first concentration that includes CMOS circuitry to control the sensor, a first well of the first conductivity type in a second concentration formed in the substrate, and a photodiode region of a second conductivity type formed in the first well. The second concentration is greater than the first concentration.

These and other objects are also achieved in an embodiment of a sensor formed in a substrate of a first conductivity type that includes CMOS circuitry to control the sensor, a first well of a second conductivity type formed in the substrate, a second well of the first conductivity type formed in the first well, and a photodiode region of the second conductivity type formed in the second well.

These and other objects are achieved in a method embodiment of the invention that includes a step of applying a first potential to a first well formed in a substrate of a first conductivity type where the substrate further includes CMOS sensor control circuitry formed in the substrate and the first well is formed to have a second conductivity type. The method further includes a step of applying a second potential to a second well of the first conductivity type that is formed in the first well where a photodiode region of the second conductivity type is formed in the second well. The first and second potentials induce a field between the first and second wells that repels photo generated charge from drifting from the first well into the second well.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
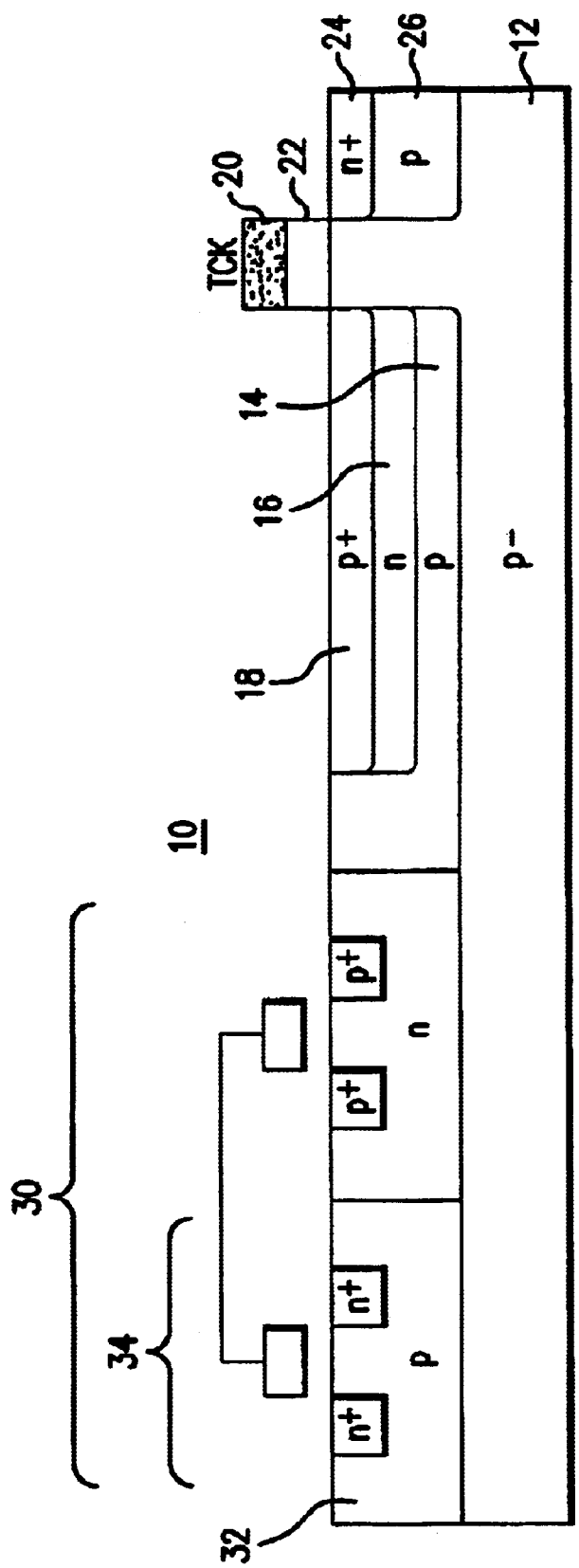
FIGS. 1–3 are section views through an isolated photodiode according to three embodiments of the present invention.
Figure 2:
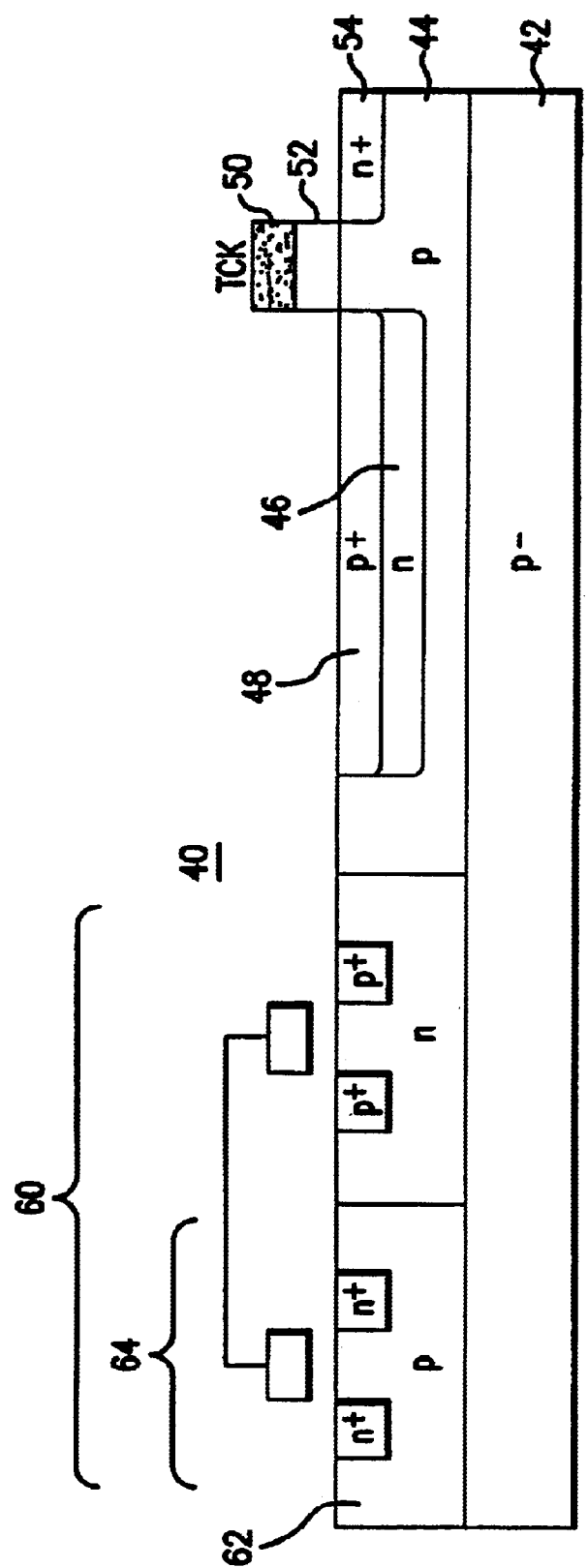
Figure 3:
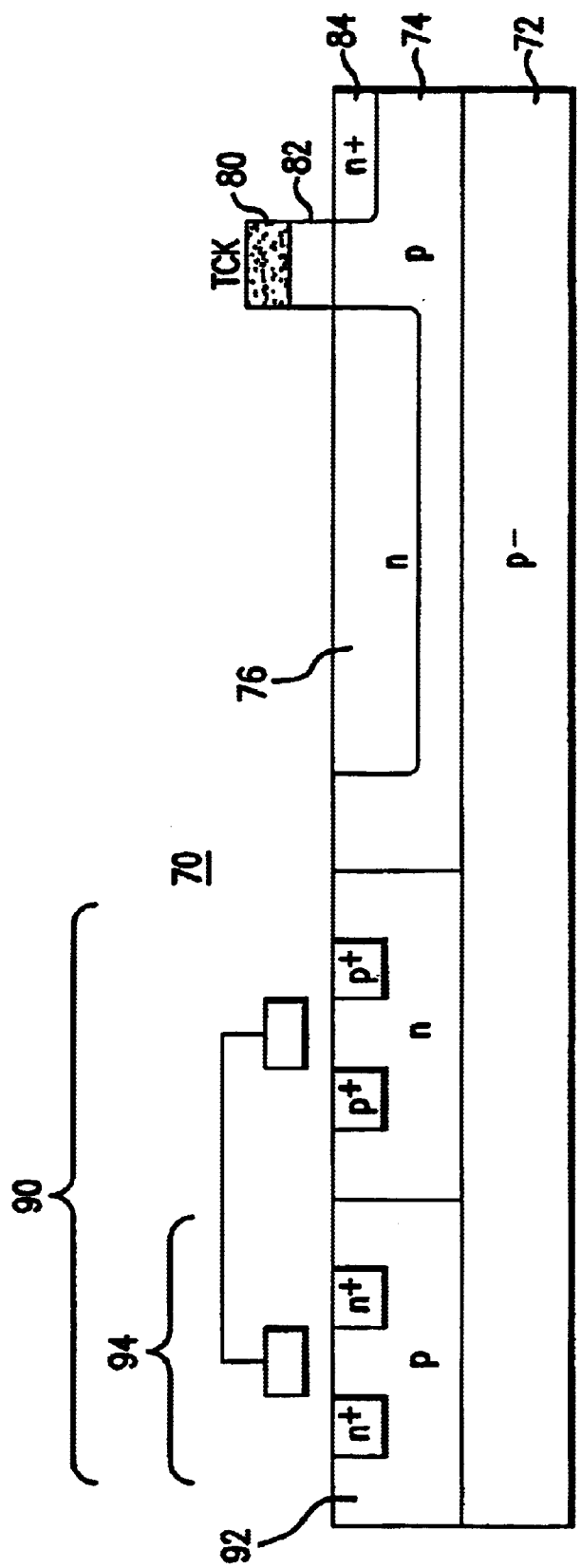
Figure 4:
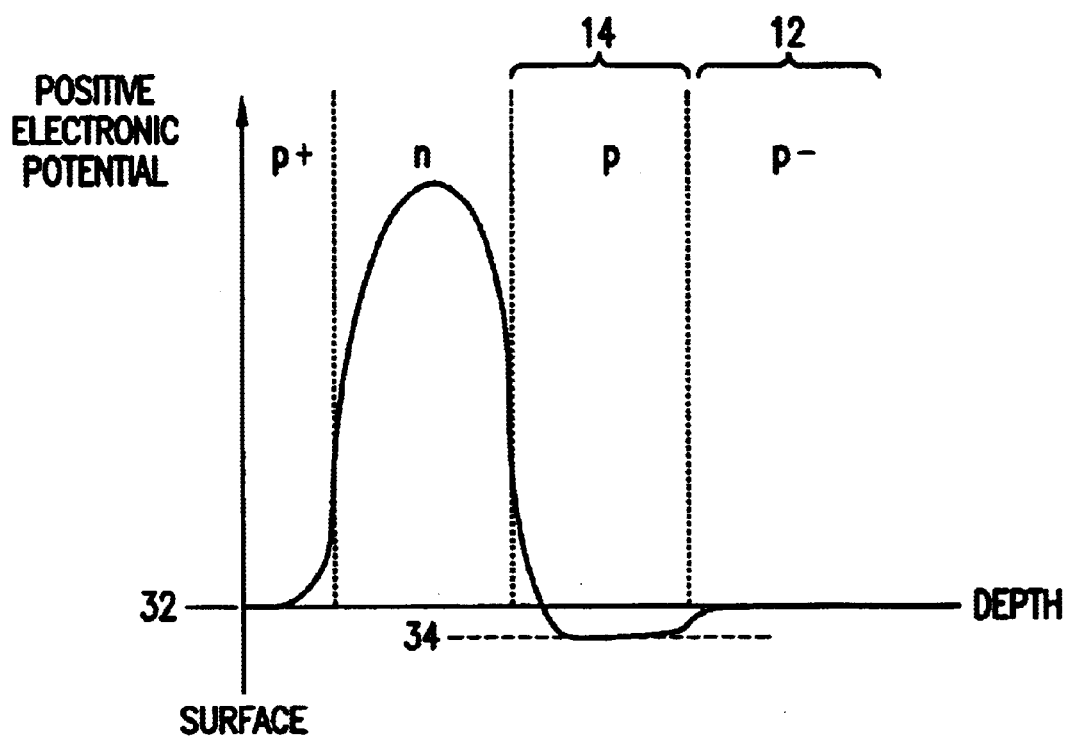
FIG. 4 is a potential well diagram representing the electric potential along a line through the photodiode region of the isolated photodiodes of FIGS. 1 and 2.

The solution to both crosstalk issues is to build in a potential barrier between the undepleted regions beneath the photosites and the wells that constitute the photosites. The present invention forms an implant structure between the substrate and the photodiode to accomplishes this. The implant structure is illustrated in FIGS. 1 to 3 for three different pixel configurations. In each case, the implant structure is constituted by a p layer that acts as the barrier layer. A representative potential curve along a line through the pixel structure into the substrate is illustrated in FIG. 4. The part of the curve that goes negative (in the p implant structure) constitutes the barrier. We call the resulting pixel an isolated photodiode (IPD).

Figure 5:
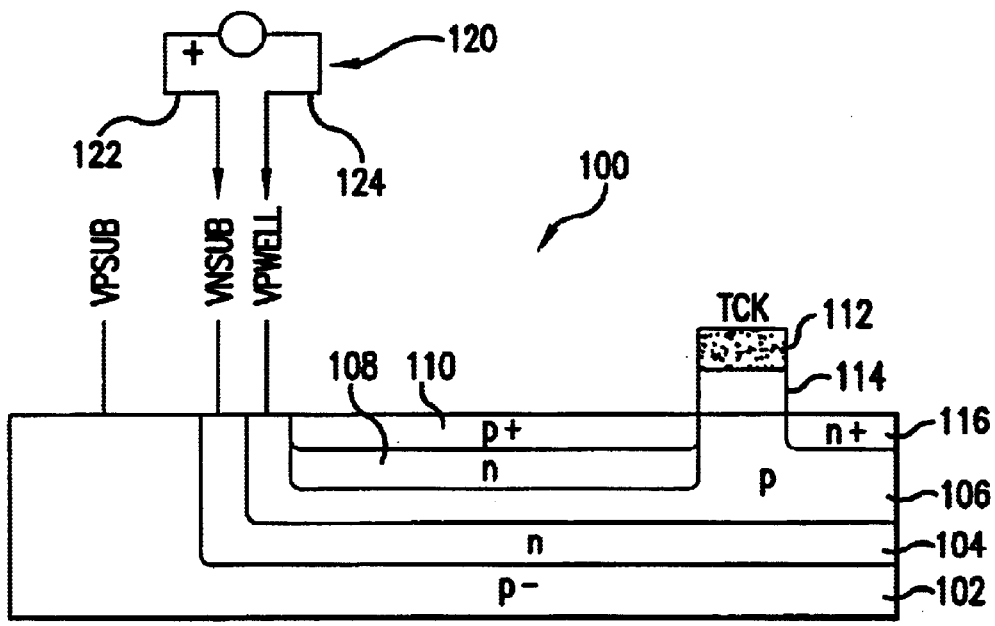
FIG. 5 is a section view through an alternative isolated photodiode according to the present invention.

In FIG. 5, another implant architecture embodiment includes an n implant (n well) formed in a p substrate and a p implant (p well) formed in the n implant (n well). Although requiring sophisticated processing technology, this would provide even better isolation than is available by the known art.

This structure needs surface connections to external biases for the p well, the n well, and the p-substrate. Conventionally, only the p-substrate connection would be present. The two additional connections are preferably made at the edge of the array in order to avoid degrading the pixel pitch and responsivity; however, the connections may be made in the pixel in some cases to prevent undesirable performance aspects (e.g., latch up).

In FIG. 1, sensor 10 is formed in substrate 12 of a first conductivity type (preferably p) in a first concentration (preferably p⁻). Sensor 10 includes CMOS circuitry 30 to control the sensor and further includes first well 14 of the first conductivity type in a second concentration (preferably p) formed in substrate 12. The second concentration (preferably p) is greater than the first concentration (preferably p⁻). Sensor 10 further includes photodiode region 16 of a second conductivity type (preferably n) formed in the first well. Sensor 10 further includes pinning layer 18 of the first conductivity type (preferably p) formed to a shallow depth in the photodiode region and electrically coupled to the substrate. Preferably, pinning layer 18 is doped to a higher concentration (preferably p⁺) than a concentration of the first well.

Sensor 10 further includes gate electrode 20 insulatively spaced by insulator 22 over substrate 12 and disposed to control a transfer of charge between photodiode region 16 and predetermined region 24 of the second conductivity type (preferably n). Predetermined region 24 may be doped to a higher concentration (preferably n⁺) than a concentration of the photodiode region. Sensor 10 further includes second well 26 of the first conductivity type in a second concentration (preferably p). Predetermined region 24 of the second conductivity type is formed in second well 26.

In sensor 10, as illustrated in FIG. 4, the first concentration in substrate 12 induces substrate 12 to express first intrinsic potential 32. The second concentration in first well 14 induces first well 14 to express second intrinsic potential 34. The first and second intrinsic potentials induce an electric field between substrate 12 and first well 14 that repels photo generated charge from drifting from substrate 12 into first well 14.

Similarly, in FIG. 2, sensor 40 is formed in substrate 42 of a first conductivity type (preferably p) in a first concentration (preferably p⁻). Sensor 40 includes CMOS circuitry 60 to control the sensor and further includes first well 44 of the first conductivity type in a second concentration (preferably p) formed in the substrate. The second concentration (preferably p) is greater than the first concentration (preferably p⁻). Sensor 40 further includes photodiode region 46 of a second conductivity type (preferably n) formed in the first well. Sensor 40 further includes pinning layer 48 of the first conductivity type (preferably p) formed to a shallow depth in the photodiode region and electrically coupled to the substrate. Preferably, pinning layer 48 is doped to a higher concentration (preferably p⁺) than a concentration of the first well.

Sensor 40 further includes gate electrode 50 insulatively spaced by insulator 52 over a portion of first well 44 and disposed to control a transfer of charge between photodiode region 46 and predetermined region 54 of the second conductivity type (preferably n). Predetermined region 54 may be doped to a higher concentration (preferably n⁺) than a concentration of the photodiode region. In sensor 40 predetermined region 54 of the second conductivity type is preferably formed in the first well.

In sensor 40 (similar to sensor 10) and as illustrated in FIG. 4, the first concentration in substrate 12 (substrate 42 in FIG. 2) induces substrate 12 (substrate 42 in FIG. 2) to express first intrinsic potential. 32. The second concentration in first well 14 (first well 44 in FIG. 2) induces first well 14 (first well 44 in FIG. 2) to express second intrinsic potential 34. The first and second intrinsic potentials induce an electric field between substrate 12 (substrate 42 in FIG. 2) and first well 14 (first well 44 in FIG. 2) that repels photo generated charge from drifting from substrate 12 (substrate 42 in FIG. 2) into first well 14 (first well 44 in FIG. 2).

In FIG. 3, sensor 70 is formed in substrate 72 of a first conductivity type (preferably p) in a first concentration (preferably p⁻). Sensor 70 includes CMOS circuitry 90 to control the sensor and further includes first well 74 of the first conductivity type in a second concentration (preferably p) formed in substrate 72. The second concentration (preferably p) is greater than the first concentration (preferably p⁻). Sensor 70 further includes photodiode region 76 of a second conductivity type (preferably n) formed in the first well.

Sensor 70 further includes gate electrode 80 insulatively spaced by insulator 82 over first well 74 and disposed to control a transfer of charge between photodiode region 76 and predetermined region 84 of the second conductivity type. In sensor 70, predetermined region 84 of the second conductivity type is formed in first well 74.

In sensor 70 (similar to sensor 10) and as illustrated in FIG. 4, the first concentration in substrate 12 (substrate 72 in FIG. 2) induces substrate 12 (substrate 72 in FIG. 2) to express first intrinsic potential 32. The second concentration in first well 14 (first well 74 in FIG. 2) induces first well 14 (first well 74 in FIG. 2) to express second intrinsic potential 34. The first and second intrinsic potentials induce an electric field between substrate 12 (substrate 72 in FIG. 2) and first well 14 (first well 74 in FIG. 2) that repels photo generated charge from drifting from substrate 12 (substrate 72 in FIG. 2) into first well 14 (first well 74 in FIG. 2). Persons skilled in the art in light of these teaching will appreciate that the surface pinning region (i.e., the p⁺region), the potential of which is depicted in FIG. 4, is absent from the structure of FIG. 3. The potential near the photodiode's surface, as depicted in FIG. 4, is that of a pinned photodiode, and the structure of FIG. 3 lacks this pinning region. However, the first and second intrinsic potentials of substrate 72 and well 74, as depicted in FIG. 4, are representative of potentials to induce an electric field between substrate 72 and first well 74 that repels photo generated charge from drifting from substrate 72 into first well 74.

In FIG. 5, sensor 100 is formed in substrate 102 of a first conductivity type (preferably p⁻). Sensor 100 includes CMOS circuitry to control the sensor and further includes first well 104 of a second conductivity type (preferably n) formed in substrate 102. Sensor 100 further includes second well 106 of the first conductivity type (preferably p) formed in the first well. Sensor 100 further includes photodiode region 108 of the second conductivity type (preferably n) formed in the second well. Sensor 100 further includes pinning layer 110 of the first conductivity type (preferably p) formed to a shallow depth in photodiode region 108 and electrically coupled to the substrate. Preferably, pinning layer 110 is doped to a higher concentration (preferably p⁺) than a concentration of the second well.

Sensor 40 further includes gate electrode 112 insulatively spaced by insulator 114 over a portion of second well 106 and disposed to control a transfer of charge between photodiode region 108 and predetermined region 116 of the second conductivity type (preferably n). Predetermined region 116 may be doped to a higher concentration (preferably n⁺) than a concentration of the photodiode region. In sensor 100 predetermined region 116 of the second conductivity type is preferably formed in the second well.

Figure 6:
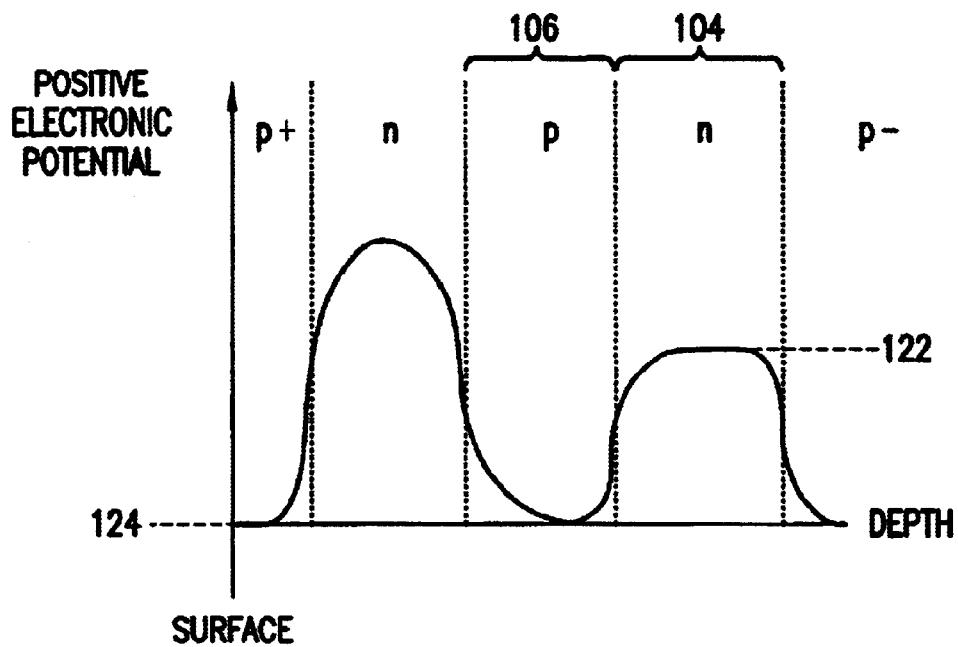
FIG. 6 is a potential well diagram representing the electric potential along a cutline through the surface gated photodiode region of the isolated photodiode of FIG. 5.

As illustrated in FIG. 5, sensor 100, advantageously includes bias circuit 120 that may be either internal or external to the sensor chip. Bias circuit 120 applies first potential 122 (VNSUB) to first well 104 and second potential 124 (VPWELL) to second well 106. In sensor 100 and as illustrated in FIG. 6, first and second potentials 122, 124 induce an electric field between first and second wells 104, 106 that repels photo generated charge from drifting from first well 104 into second well 106.

A method of isolating a photodiode includes a step of applying first potential 122 to first well 104 formed in substrate 102 of a first conductivity type (preferably p−). Substrate 102 further including CMOS sensor control circuitry formed in the substrate. First well 104 is formed to have a second conductivity type (preferably n). The method further includes a step of applying second potential 124 to second well 106 of the first conductivity type (preferably p). Second well 106 is formed in first well 104. Photodiode region 108 of the second conductivity type (preferably n) is formed in second well 106. The steps of applying the first and second potentials induce an electric field between first and second wells 104, 108 that repels photo generated charge from drifting from first well 104 into second well 106.

In a variant, the method, further includes a step of applying a third potential to gate electrode 112 that is insulatively spaced by insulator 114 over second well 106 to enable a transfer of charge between photodiode region 108 and predetermined region 116 of the second conductivity type (preferably n).

The present invention is implemented in sensors using CMOS technology and not the CCD gate technology customary with CCD sensors. Interline transfer sensors implemented in CCD technology are known to use a separate p well implanted beneath a pinned photodiode (PPD) and associated CCD type pixel gates in order to act as a barrier to charge generated outside the CCD part of the pixel. In contrast, a pixel of the present invention is implemented with CMOS technology and lacks the presence of CCD type gates.

The present invention takes advantage of a customary CMOS process. In particular, a p well (32, 62, 92) is used in the conventional CMOS process beneath n-FETs (34, 64, 94) to adjust the behavior of the n-FETs (e.g., to achieve a useful threshold voltage $V_T$). The inventor discovered that this same p well customarily used in the CMOS process, in the same implant cycle as used in the CMOS process, can also be used to form p-region 14, 44 or 74 in FIG. 1, 2 or 3. There is no need to add any additional processes. The inventor discovered that the customary CMOS p well implant beneath n-FETs also produces a barrier that can reduce cross talk in four transistor pixels and five transistor pixels.

Figure 7:
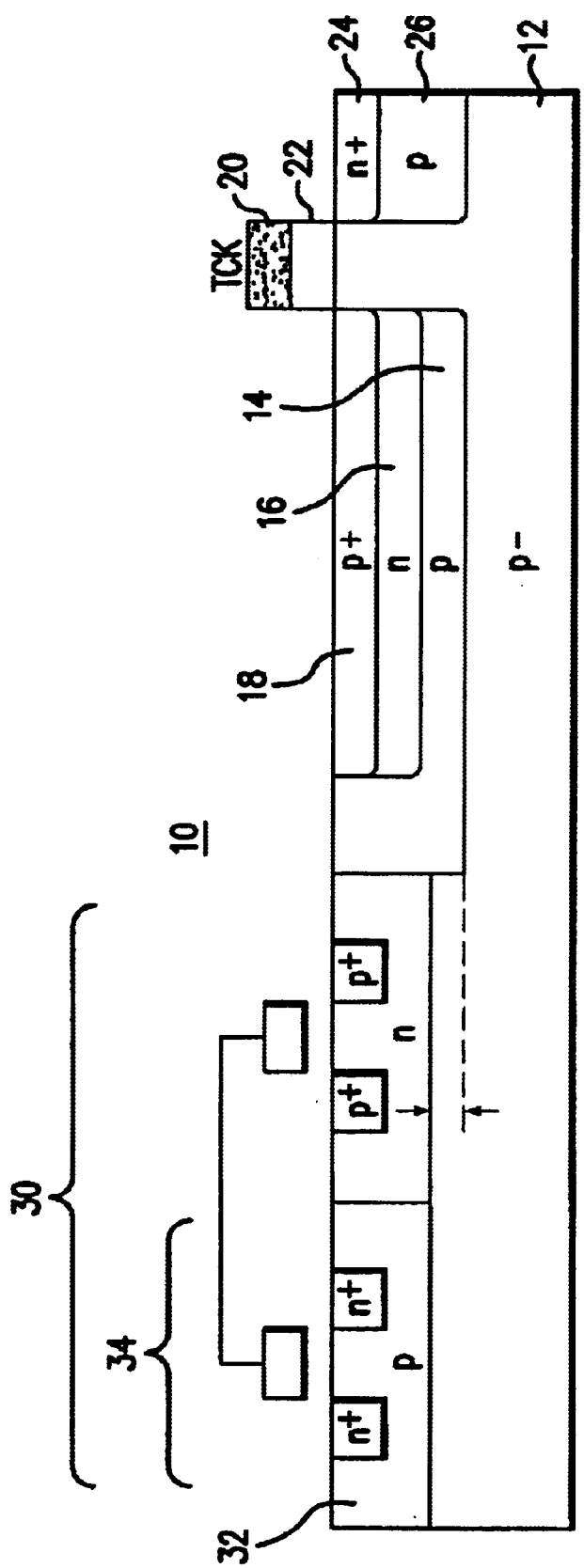
FIGS. 7–9 are section views through the isolated photodiodes of FIGS. 1–3 except with the depth of the implant beneath the photodiode increased.
Figure 8:
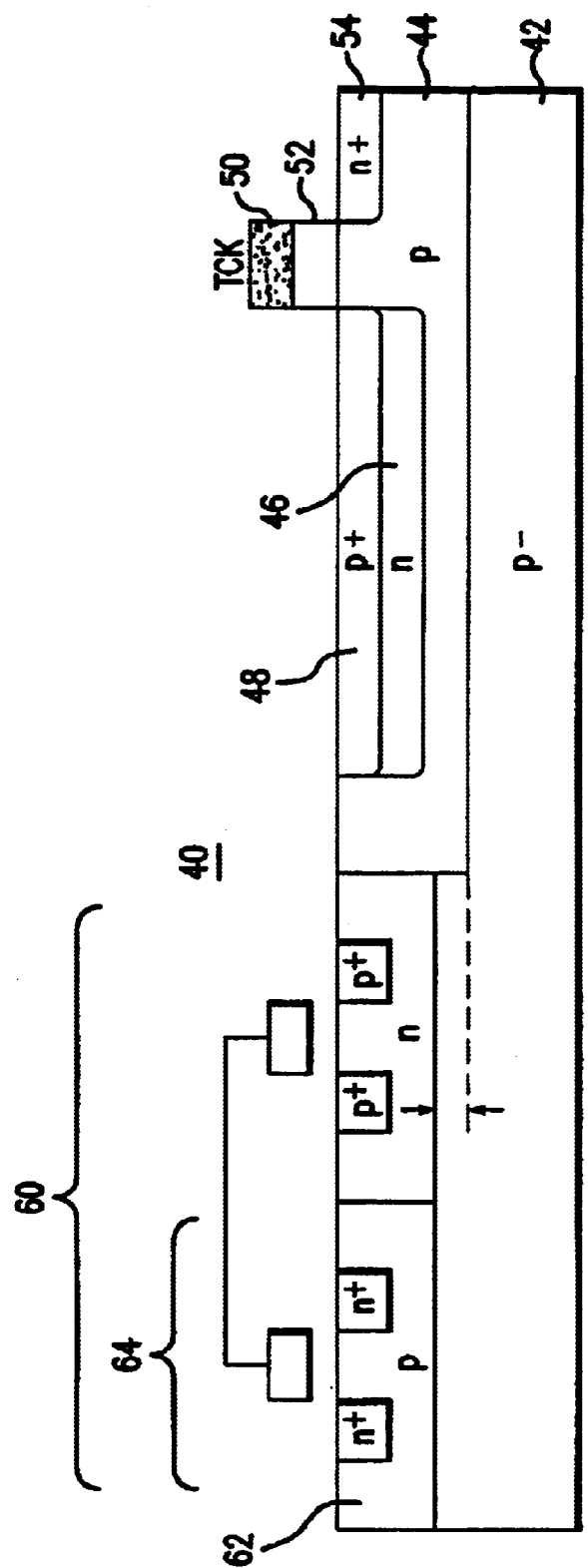
Figure 9:
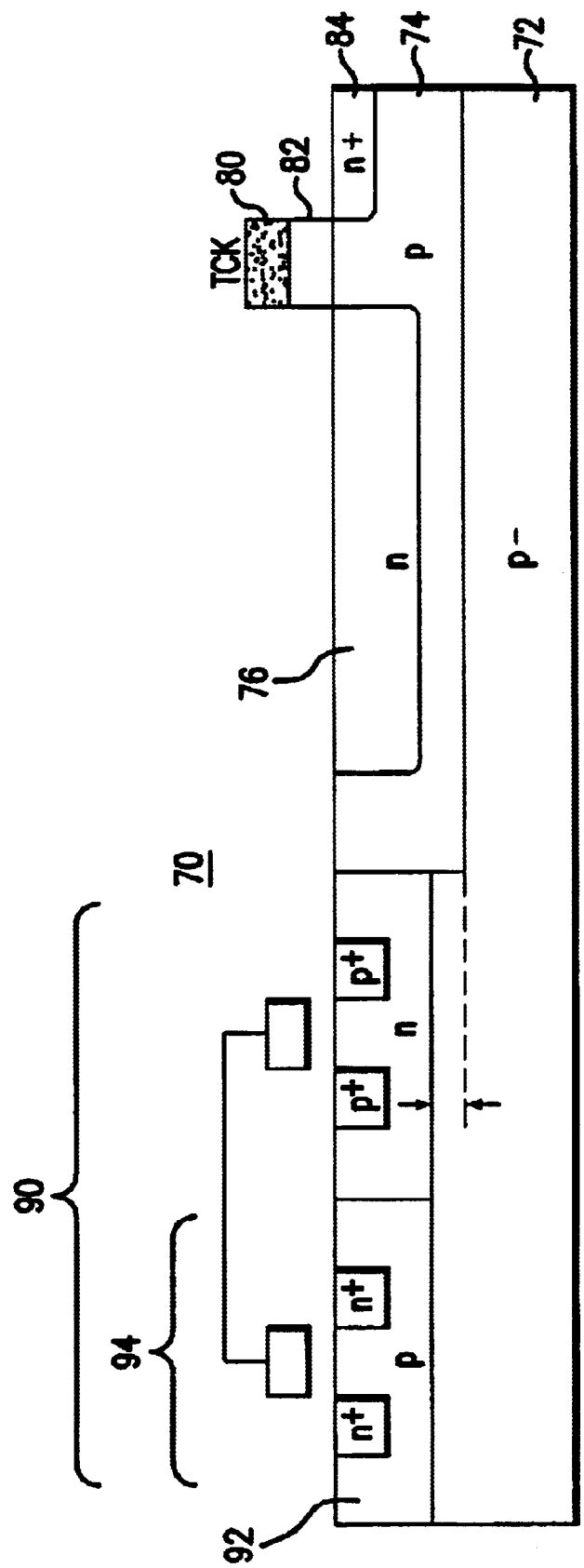

In an alternative variant, the p implant beneath the photodiode is increased in dose and/or depth to produce a higher barrier when needed. This increased dose and/or depth (see FIGS. 7, 8, 9) would require an extra implant process above and beyond the conventional CMOS p well implant process.

U.S. Pat. No. 6,100,556 to Drowley et al. in FIG. 1 discloses p well 16 formed in first portion 13 of p substrate 11. Drowley et al. discloses that p well 16 facilitates forming other CMOS devices. Drowley et al. also discloses that in second portion 14 of substrate 11 is formed a pinned photodiode that includes n region 26 and pinning layer 37. Notably, the pinned photodiode in second portion 14 is not formed in p well 16. Drowley et al. explicitly mask p well 16 from the photodiode area so that the depth of the depletion region can optimize because Drowley et al. are most interested in the color response (i.e., want as deep a depletion region as possible so as to maximize red response).

In Drowley et al., p well 16 is just the p well used in the conventional CMOS process beneath n-FETs to adjust the behavior of the n-FETs (e.g., to achieve a useful threshold voltage $V_T$). In contrast to the teaching of Drowley et al., the inventor of the present patent discovered that this same p well (that is customarily used in the CMOS process, in the same implant cycle as used in the CMOS process) can also be used to form p-region 14, 44 or 74 in FIG. 1, 2 or 3 and prevent stray charges from diffusing into the photodiode. There is no need to add any additional processes.

Figure 10:
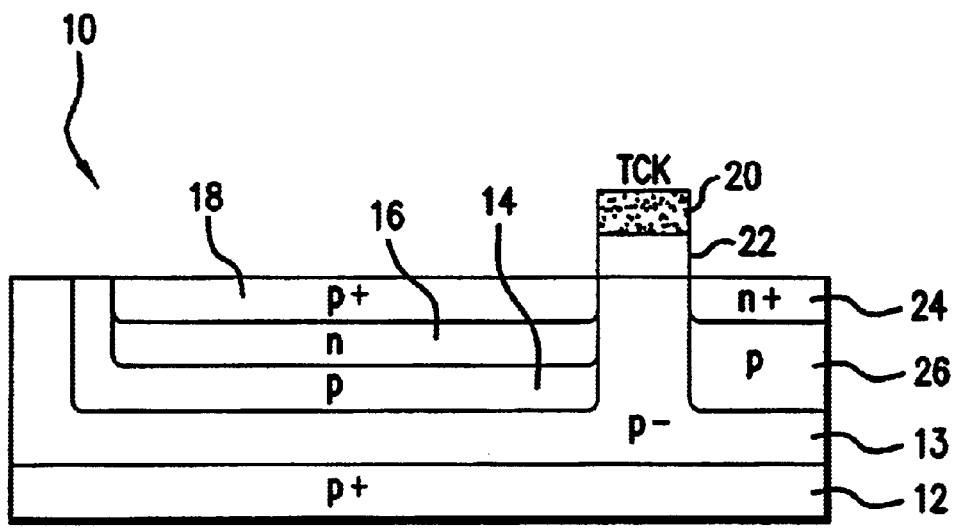
FIGS. 10–12 are section views through the isolated photodiodes of FIGS. 1–3 except with isolated photodiodes formed in a lightly doped epi that is disposed on the substrate.
Figure 11:
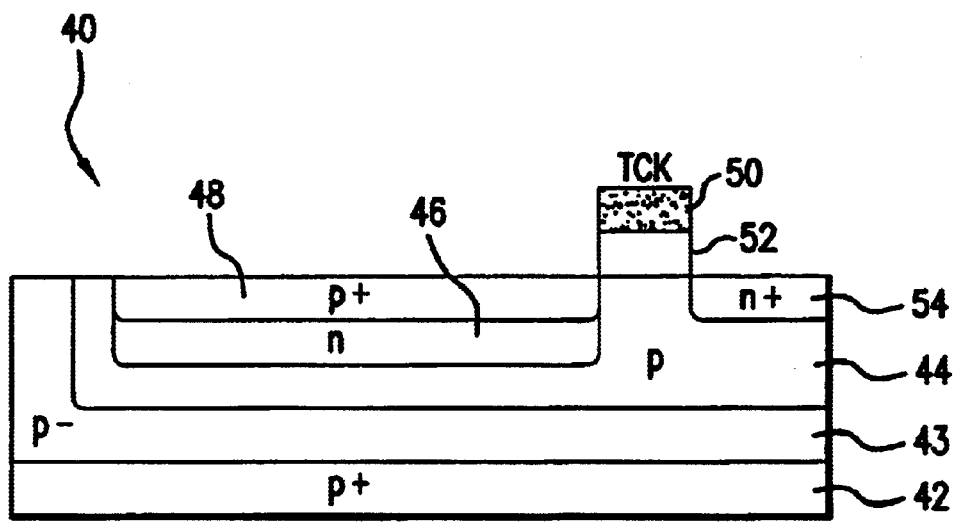
Figure 12:
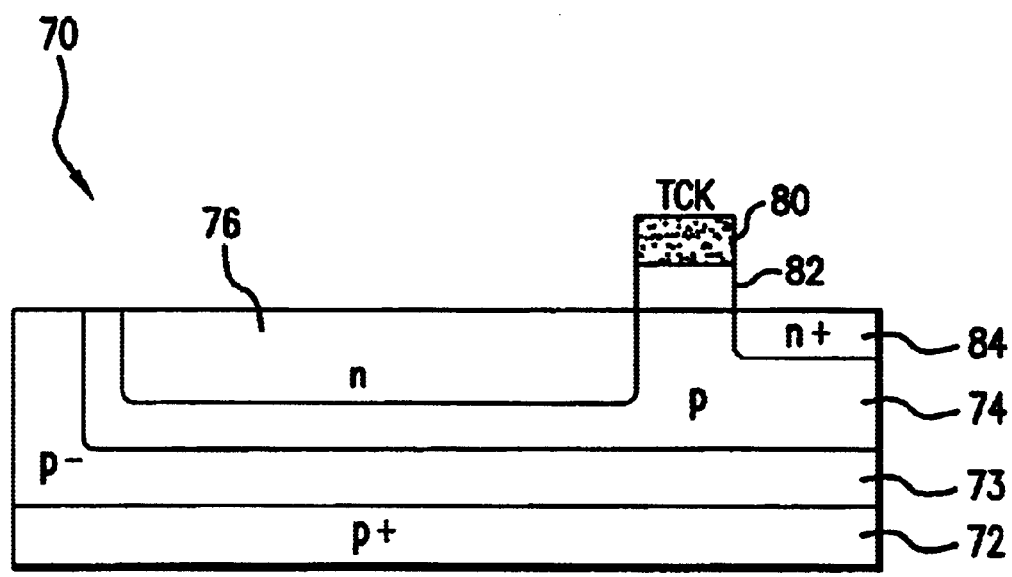

In an alternative embodiment, a lightly doped p− type epi (13, 43, 73 of FIGS. 10, 11, 12) is grown on a more heavily doped p+ type substrate. The p+ type substrate is typically several hundred micron thick, and the p− type epi is typically several microns deep. Then, the p well (e.g., p-region 14, 44 or 74 in FIGS. 10, 11, 12) is formed in the p− type epi, but only so deep as to extend down a few microns into the p− type epi. In operation, any electron that ventures into, or is photo formed in, the heavily doped p+ type substrate recombines almost immediately with holes (i e., the majority carrier in the p+ type substrate) due to the heavy concentration of dopant ions. These electrons never have a chance to diffuse back into the p− type epi and then potentially into the storage well that is the photodiode. Meanwhile, the p well barrier (e.g., p-region 14, 44 or 74 in FIGS. 10, 11, 12) prevents any free charge in the p− type epi region from diffusing into the storage well.

Persons of ordinary skill in the art will appreciate, and as used herein, a process disclosed as forming a well in a substrate also includes forming a well in an epi layer that is grown on a substrate. In such case, the epi layer itself is regarded as the substrate. Distinguishing the epi layer from the substrate is unnecessary unless a disclosure is expressly that of a structure or method in which both epi layer and substrate are in a combination that is distinguished from the prior art.

Having described preferred embodiments of a novel isolated photodiode (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A sensor formed in a substrate of a first conductivity type in a first concentration comprising:
   CMOS circuitry to control the sensor;
   a first well of the first conductivity type in a second concentration formed in the substrate, the second concentration being greater than the first concentration;
   a photodiode region of a second conductivity type formed in the first well; and
   a pinning layer of the first conductivity type formed to a shallow depth in the photodiode region and electrically coupled to the substrate.

2. The sensor of claim 1, further comprising a gate electrode insulatively spaced over the first well and disposed to control a transfer of charge between the photodiode region and a predetermined region of the second conductivity type.

3. The sensor of claim 2, wherein the predetermined region of the second conductivity type is formed in the first well.

4. The sensor of claim 1, further comprising a gate electrode insulatively spaced over the substrate and disposed to control a transfer of charge between the photodiode region and a predetermined region of the second conductivity type.

5. The sensor of claim 4, further comprising a second well of the first conductivity type in the second concentration, wherein the predetermined region of the second conductivity type is formed in the second well.

6. A sensor formed in a substrate of a first conductivity type in a first concentration comprising:
   CMOS circuitry to control the sensor;
   a first well of the first conductivity type in a second concentration formed in the substrate, the second concentration being greater than the first concentration; and
   a photodiode region of a second conductivity type formed in the first well,
   wherein the CMOS circuitry includes a CMOS well of the first conductivity type and at least one FET formed in the CMOS well, and
   wherein the CMOS well is formed to a lesser depth than a depth of the first well.

7. A sensor formed in a substrate of a first conductivity type in a first concentration comprising:
   CMOS circuitry to control the sensor;
   a first well of the first conductivity type in a second concentration formed in the substrate, the second concentration being greater than the first concentration; and
   a photodiode region of a second conductivity type formed in the first well,
   wherein the CMOS circuitry includes a CMOS well of the first conductivity type and at least one FET formed in the CMOS well, and
   wherein the CMOS process type well is formed to a lesser concentration than the second concentration.

8. A sensor formed in a substrate of a first conductivity type comprising:
   CMOS circuitry to control the sensor;
   a first well of a second conductivity type formed in the substrate;
   a second well of the first conductivity type formed in the first well; and
   a photodiode region of the second conductivity type formed in the second well.

9. The sensor of claim 8, further comprising a pinning layer of the first conductivity type formed to a shallow depth in the photodiode region and electrically coupled to the substrate.

10. The sensor of claim 8, further comprising a gate electrode insulatively spaced over the second well and disposed to control a transfer of charge between the photodiode region and a predetermined region of the second conductivity type.

11. The sensor of claim 10, wherein the predetermined region of the second conductivity type is formed in the second well.

12. The sensor of claim 8, further comprising a bias circuit that applies a first potential to the first well and a second potential to the second well wherein the first and second potentials induce a field between the first and second wells that repels photo generated charge from drifting from the first well into the second well.

13. A sensor formed in a substrate of a first conductivity type in a first concentration comprising:
   CMOS circuitry to control the sensor
   an epi layer of the first conductivity type in a second concentration formed on the substrate, the second concentration being less than the first concentration;
   a first well of the first conductivity type in a third concentration formed in the epi layer, the third concentration being greater than the second concentration; and
   a photodiode region of a second conductivity type formed in the first well.

14. A sensor formed in a substrate of a first conductivity type in a first concentration comprising:
   CMOS circuitry to control the sensor;
   an epi layer of the first conductivity type in a second concentration, the second concentration being less than the first concentration;
   a first well of a second conductivity type formed in the epi layer;
   a second well of the first conductivity type formed in the first well; and
   a photodiode region of the second conductivity type formed in the second well.

15. A sensor formed in a substrate of a first conductivity type in a first concentration comprising:
   CMOS circuitry to control the sensor;
   a first well of the first conductivity type in a second concentration formed in the substrate, the second concentration being greater than the first concentration;
   a second well of the first conductivity type in the second concentration;
   a predetermined region of the second conductivity type formed in the second well;
   a gate electrode insulatively spaced over the substrate and disposed to control a transfer of charge between the photodiode region and the predetermined region; and
   a photodiode region of a second conductivity type formed completely within the first well.

16. The sensor of claim 15, further comprising a pinning layer formed to a shallow depth in the photodiode region and electrically coupled to the substrate.

* * * * *